United States Patent
Zhou et al.

(10) Patent No.: US 12,096,704 B2
(45) Date of Patent: Sep. 17, 2024

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Yuan Zhou, Singapore (SG); Xian Feng Du, Singapore (SG); Guoan Du, Singapore (SG); Guohai Zhang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/383,473

(22) Filed: Oct. 24, 2023

(65) Prior Publication Data

US 2024/0057486 A1 Feb. 15, 2024

Related U.S. Application Data

(63) Continuation of application No. 17/353,757, filed on Jun. 21, 2021, now Pat. No. 11,844,291.

(51) Int. Cl.
*H10N 70/00* (2023.01)
*H10N 70/20* (2023.01)

(52) U.S. Cl.
CPC ........... *H10N 70/063* (2023.02); *H10N 70/24* (2023.02); *H10N 70/826* (2023.02); *H10N 70/841* (2023.02)

(58) Field of Classification Search
CPC .... H10N 70/063; H10N 70/24; H10N 70/826; H10N 70/841; H10N 70/801
See application file for complete search history.

(56) References Cited

U.S. PATENT DOCUMENTS

| | | |
|---|---|---|
| 8,963,114 B2 | 2/2015 | Liao |
| 9,178,144 B1 | 11/2015 | Sung |
| 9,431,604 B2 | 8/2016 | Liao |
| 10,153,432 B2 | 12/2018 | Zhu |
| 2004/0264240 A1 | 12/2004 | Hineman |
| 2016/0380183 A1 | 12/2016 | Chuang |
| 2019/0157099 A1* | 5/2019 | Chen ................ H01L 21/31055 |
| 2020/0161236 A1 | 5/2020 | Kim |
| 2020/0388759 A1 | 12/2020 | Liu |
| 2020/0395539 A1 | 12/2020 | Wei |
| 2020/0395541 A1 | 12/2020 | Singh |
| 2021/0336126 A1 | 10/2021 | Shen |
| 2022/0246680 A1 | 8/2022 | Chiu |

* cited by examiner

*Primary Examiner* — Shih Tsun A Chou
(74) *Attorney, Agent, or Firm* — Winston Hsu (57) ABSTRACT

A semiconductor memory device includes a substrate having a first interlayer dielectric layer thereon; a lower metal interconnect layer in the first interlayer dielectric layer; a conductive via disposed on the lower metal interconnect layer; a bottom electrode disposed on the conductive via; a dielectric data storage layer having variable resistance disposed on the bottom electrode; a top electrode disposed on the dielectric data storage layer; and a protective layer covering sidewalls of the top electrode, the dielectric data storage layer, and the bottom electrode. The protective layer includes an annular, upwardly protruding portion around a perimeter of the top electrode.

20 Claims, 6 Drawing Sheets

SEMICONDUCTOR MEMORY DEVICE AND FABRICATION METHOD THEREOF

CROSS REFERENCE TO RELATED APPLICATIONS

This application is a continuation application of U.S. application Ser. No. 17/353,757, filed on Jun. 21, 2021. The content of the application is incorporated herein by reference.

BACKGROUND OF THE INVENTION

1. Field of the Invention

The present invention relates to the field of semiconductor technology, and particularly relates to a semiconductor memory device and a manufacturing method thereof.

2. Description of the Prior Art

Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two electrodes disposed within back-end-of-the-line (BEOL) metallization layers.

However, the RRAM embedded within BEOL metallization layers suffers from small marginal photo alignment window (resistive sense element (RSE) to short via photo) due to non-transparent metal electrode, which causes short via not full covered by spacer and bottom metal copper out diffusion issue. Moreover, the trench over-etch may cause top metal and RSE bottom electrode bridging.

SUMMARY OF THE INVENTION

It is one purpose of the present invention to provide a semiconductor device and a manufacturing method thereof to solve the above-mentioned drawbacks or shortcomings of the prior art.

One aspect of the invention provides a semiconductor memory device includes a substrate having a first interlayer dielectric layer thereon; a lower metal interconnect layer in the first interlayer dielectric layer; a conductive via disposed on the lower metal interconnect layer; a bottom electrode disposed on the conductive via; a dielectric data storage layer having variable resistance disposed on the bottom electrode; a top electrode disposed on the dielectric data storage layer; and a protective layer covering sidewalls of the top electrode, the dielectric data storage layer, and the bottom electrode. The protective layer includes an annular, upwardly protruding portion around a perimeter of the top electrode.

According to some embodiments, the semiconductor memory device further includes a second interlayer dielectric layer disposed around the conductive via and above the lower metal interconnect layer.

According to some embodiments, the protective layer is in direct contact with the second interlayer dielectric layer.

According to some embodiments, the semiconductor memory device further includes an etch stop layer disposed under the second interlayer dielectric layer and around the conductive via. The etch stop layer caps the lower metal interconnect layer, and wherein the protective layer extends onto the etch stop layer.

According to some embodiments, the etch stop layer is a nitrogen-doped silicon carbide layer.

According to some embodiments, the conductive via is a copper via.

According to some embodiments, the protective layer is in direct contact with a top surface or a sidewall of the conductive via.

According to some embodiments, the protective layer comprises silicon nitride, and wherein the protective layer has a thickness of about 200-400 angstroms.

According to some embodiments, the semiconductor memory device further includes an annular oxide layer under the annular, upwardly protruding portion.

According to some embodiments, the semiconductor memory device further includes an ultra-low dielectric constant layer covering the protective layer; and an upper metal interconnect layer in the ultra-low dielectric constant layer, wherein a lower portion of the upper metal interconnect layer engages with the annular, upwardly protruding portion.

According to some embodiments, the top electrode and the bottom electrode comprise TaN, and the dielectric data storage layer comprises $Ta_2O_5$.

Another aspect of the invention provides a method for forming a semiconductor memory device. A substrate having a first interlayer dielectric layer thereon is provided. A lower metal interconnect layer is formed in the first interlayer dielectric layer. A conductive via is formed on the lower metal interconnect layer. A bottom electrode is formed on the conductive via. A dielectric data storage layer having variable resistance is formed on the bottom electrode. A top electrode is formed on the dielectric data storage layer. A protective layer covering sidewalls of the top electrode is formed, the dielectric data storage layer, and the bottom electrode. The protective layer includes an annular, upwardly protruding portion around a perimeter of the top electrode.

According to some embodiments, the method further includes the step of forming a second interlayer dielectric layer disposed around the conductive via and above the lower metal interconnect layer.

According to some embodiments, the protective layer is in direct contact with the second interlayer dielectric layer.

According to some embodiments, the method further includes the step of forming an etch stop layer under the second interlayer dielectric layer and around the conductive via, wherein the etch stop layer caps the lower metal interconnect layer, and wherein the protective layer extends onto the etch stop layer.

According to some embodiments, the etch stop layer is a nitrogen-doped silicon carbide layer.

According to some embodiments, the conductive via is a copper via.

According to some embodiments, the protective layer is in direct contact with a top surface or a sidewall of the conductive via.

According to some embodiments, the protective layer comprises silicon nitride, and wherein the protective layer has a thickness of about 200-400 angstroms.

According to some embodiments, the method further includes the step of forming an annular oxide layer under the annular, upwardly protruding portion.

According to some embodiments, the method further includes the step of forming an ultra-low dielectric constant layer covering the protective layer; and forming an upper metal interconnect layer in the ultra-low dielectric constant layer, wherein a lower portion of the upper metal interconnect layer engages with the annular, upwardly protruding portion.

According to some embodiments, the top electrode and the bottom electrode comprise TaN, and the dielectric data storage layer comprises $Ta_2O_5$.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

The present invention pertains to a resistive random access memory (RRAM) device and a method for making the same. An extraordinary self-aligned higher and thicker spacer is introduced to cover the short via, the resistive sense element (RSE), and the top metal such that when RSE to short via misalignment occurs, the cooper out diffusion can be avoided. The problem of metal bridging between the top metal and the short via when over-etch occurs can also be solved.

Figure 1:
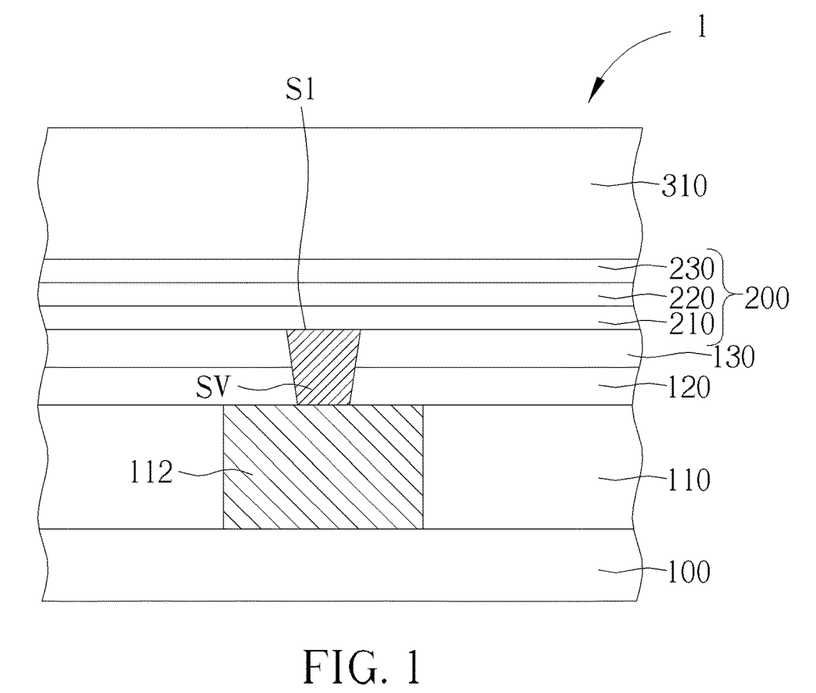
FIG. 1 to FIG. 10 are schematic, cross-sectional diagrams showing a method for forming a resistive random access memory (RRAM) device in accordance with one embodiment of the invention.

FIG. 1 to FIG. 10 are schematic, cross-sectional diagrams showing a method for forming a resistive random access memory (RRAM) device in accordance with one embodiment of the invention. As shown in FIG. 1, a substrate 100, such as a semiconductor substrate is provided. A first interlayer dielectric layer 110 may be provided on the substrate 100. According to an embodiment, the first interlayer dielectric layer 110 may comprise a low dielectric constant (low-k) or ultra-low k dielectric material. A lower metal interconnect layer 112 is formed in the first interlayer dielectric layer 110. For example, the lower metal interconnect layer 112 may be a copper metal layer or a copper damascene layer.

According to an embodiment, an etch stop layer 120 is disposed on the lower metal interconnect layer 112 and on the first interlayer dielectric layer 110. According to an embodiment, for example, the etch stop layer 120 may be a nitrogen-doped silicon carbide layer, but is not limited thereto. According to an embodiment, the etch stop layer 120 may have a thickness of about 200-500 angstroms, for example, 350 angstroms. A second interlayer dielectric layer 130 such as a silicon oxide layer may be formed on the etch stop layer 120. According to an embodiment, the second interlayer dielectric layer 130 may have a thickness of about 500-700 angstroms, for example, 600 angstroms.

According to an embodiment, a conductive via SV is formed in the second interlayer dielectric layer 130 and the etch stop layer 120 and is electrically connected to the lower metal interconnect layer 112. According to some embodiments, the conductive via SV may be a copper via. According to an embodiment, the conductive via SV penetrates through the second interlayer dielectric layer 130 and the etch stop layer 120. According to an embodiment, the conductive via SV has a top surface S1 that is flush with the top surface 130s of the second interlayer dielectric layer 130. The etch stop layer 120 is disposed around the conductive via SV. The etch stop layer 120 caps the lower metal interconnect layer 112.

According to an embodiment, a resistive sense element (RSE) layer 200 is then formed on the conductive via SV and the second interlayer dielectric layer 130. According to an embodiment, for example, the RSE layer 200 may comprise a bottom electrode layer 210 formed on the conductive via SV and on the second interlayer dielectric layer 130, a dielectric data storage layer 220 having variable resistance on the bottom electrode layer 210, and a top electrode layer 230 on the dielectric data storage layer 220.

According to an embodiment, for example, the top electrode layer 230 and the bottom electrode layer 210 may comprise TaN, and the dielectric data storage layer 220 may comprise $Ta_2O_5$ and/or TaOx. According to an embodiment, for example, the top electrode layer 230 may have a thickness of about 500-700 angstroms, for example, 600 angstroms. According to an embodiment, for example, the bottom electrode layer 210 may have a thickness of about 150-250 angstroms, for example, 200 angstroms.

According to an embodiment, a hard mask layer 310 is formed on the RSE layer 200. According to an embodiment, for example, the hard mask layer 310 may comprise a silicon oxide layer, but is not limited thereto. According to an embodiment, for example, the hard mask layer 310 may have a thickness of about 600-800 angstroms, for example, 700 angstroms.

Figure 2:
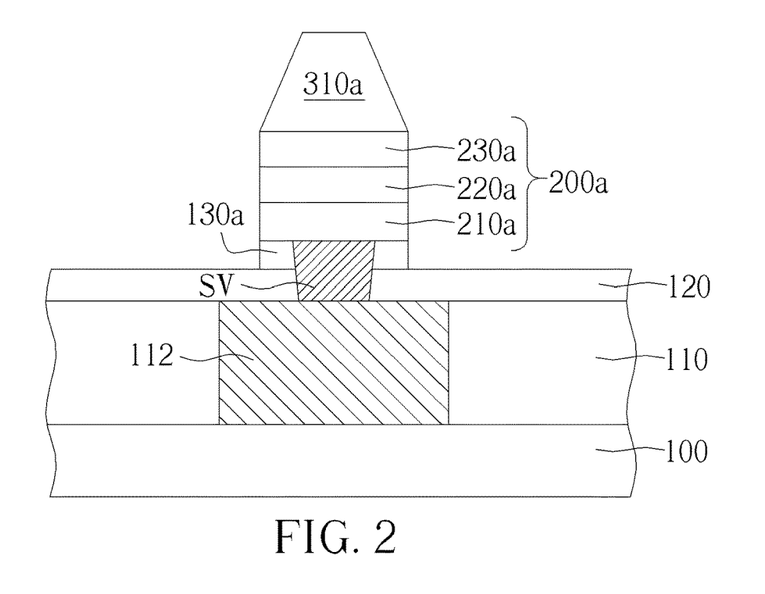

As shown in FIG. 2, an etching process such a dry etching process is performed to pattern the hard mask layer 310, the RSE layer 200 and the second interlayer dielectric layer 130, thereby forming a patterned hard mask layer 310a on the RSE structure 200a. The RSE structure 200a comprises top electrode 230a, a bottom electrode 210a, and a patterned dielectric data storage layer 220a between the top electrode 230a and the bottom electrode 210a.

According to an embodiment, the second interlayer dielectric layer 130 is patterned into an annular-shaped dielectric layer 130a that surrounds the conductive via SV. According to an embodiment, the etching process stops on the etch stop layer 120. According to an embodiment, the patterned hard mask layer 310a has a tapered sidewall profile. According to an embodiment, the patterned hard mask layer 310a may have a truncated cone shape.

Figure 3:
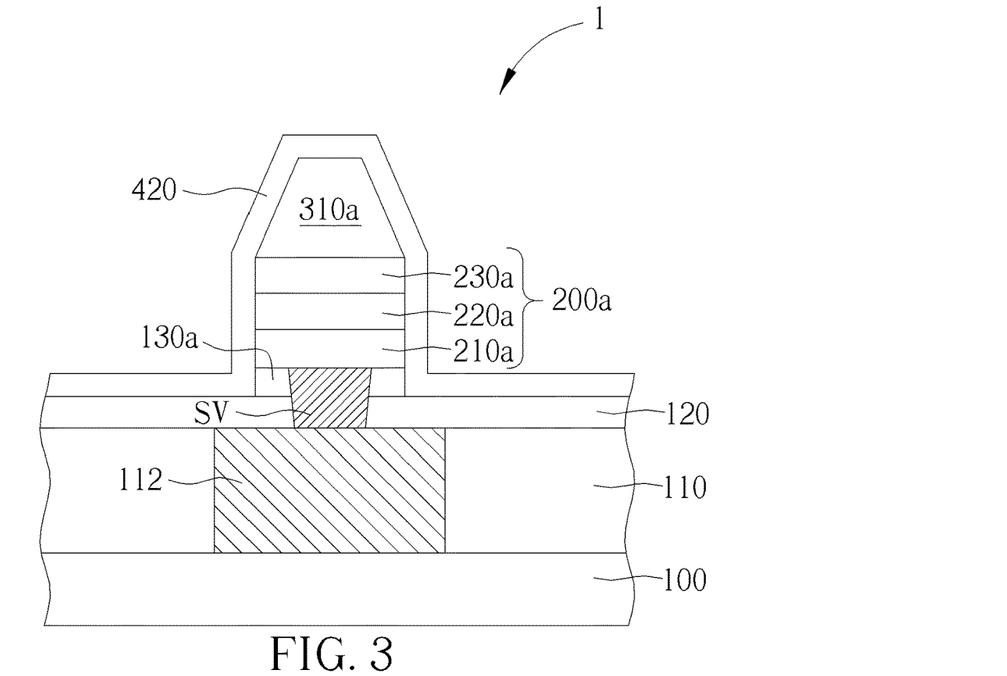

As shown in FIG. 3, subsequently, a protective layer 420 is conformally deposited on the substrate 100. According to some embodiments, the protective layer 420 is in direct contact with the annular-shaped dielectric layer 130a. According to an embodiment, the protective layer 420 covers the patterned hard mask layer 310, sidewalls of the RSE structure 200a, and sidewalls of the annular-shaped dielectric layer 130a. The protective layer 420 also extends onto the etch stop layer 110. According to some embodiments, for example, the protective layer 420 may comprise silicon nitride. According to some embodiments, for example, the protective layer 420 may have a thickness of about 200-400 angstroms.

Figure 4:
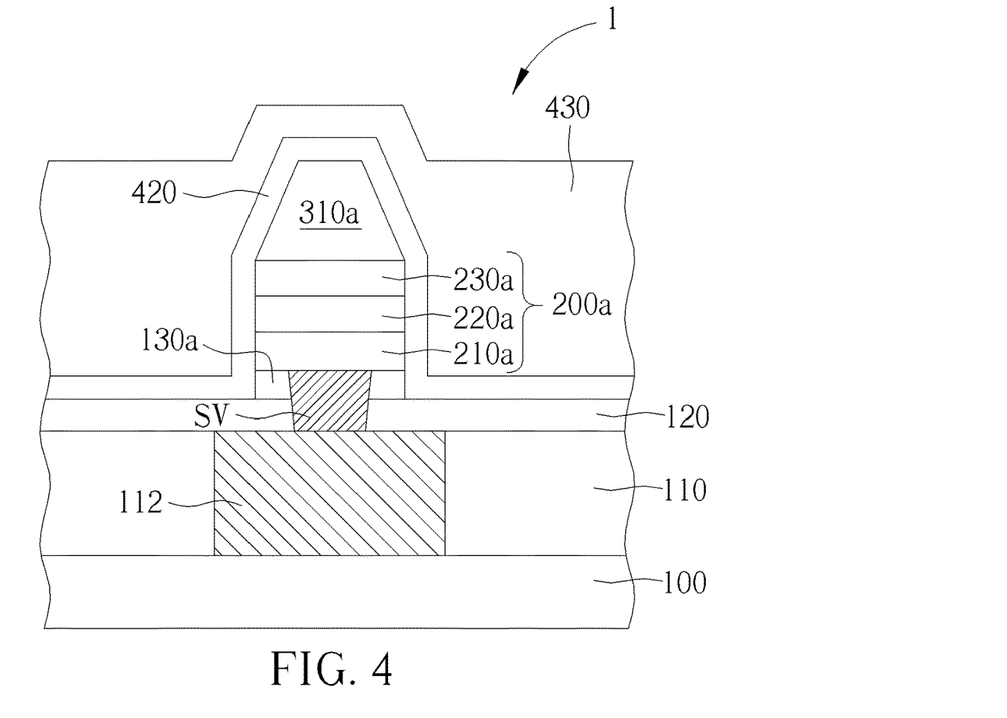

As shown in FIG. 4, a bottom anti-reflection coating (BARC) layer 430 may be deposited on the protective layer 420.

Figure 5:
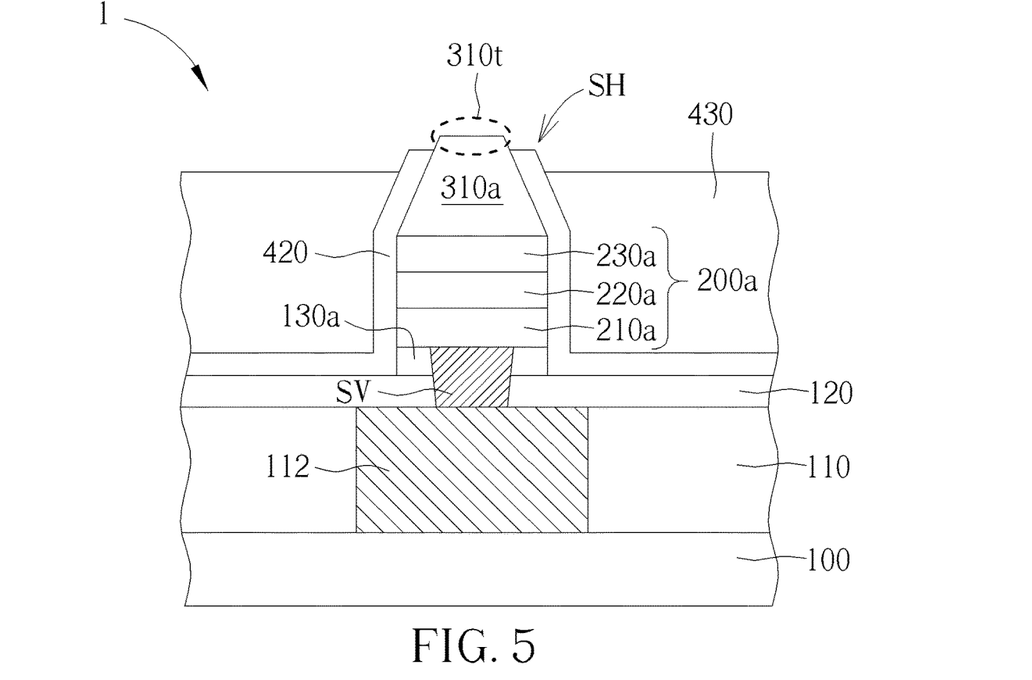

As shown in FIG. 5, a self-aligned etching process is then carried out to partially etch the BARC layer 430 and partially etch the protective layer 420, until an upper portion 310t of the patterned hard mask layer 310a is revealed. At this point, a step height SH may be formed between the protective layer 420 and the remaining BARC layer 430 around the upper portion 310t of the patterned hard mask layer 310a.

Figure 6:
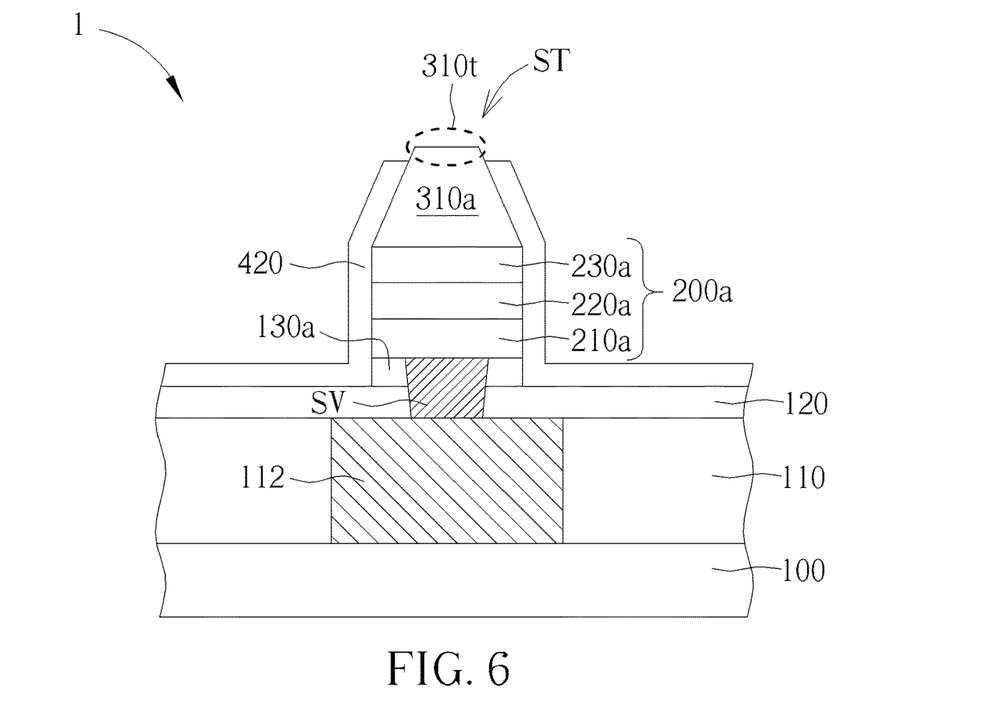

As shown in FIG. 6, the remaining BARC layer 430 is removed. The upper portion 310t of the patterned hard mask layer 310a and the protective layer 420 are exposed.

Figure 7:
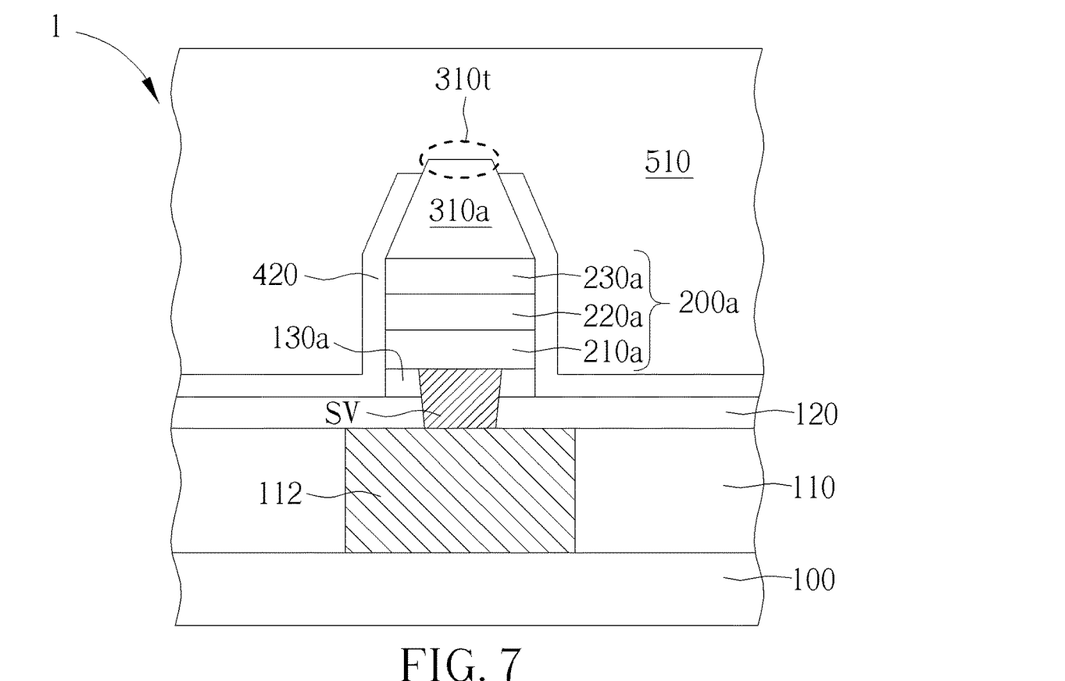

As shown in FIG. 7, an ultra-low k layer 510 is then deposited to cover the protective layer 420 and the upper portion 310t of the patterned hard mask layer 310a. For example, ultra-low k layer 510 may comprise SiCOH, wherein the value of k is about 2.1.

Figure 8:
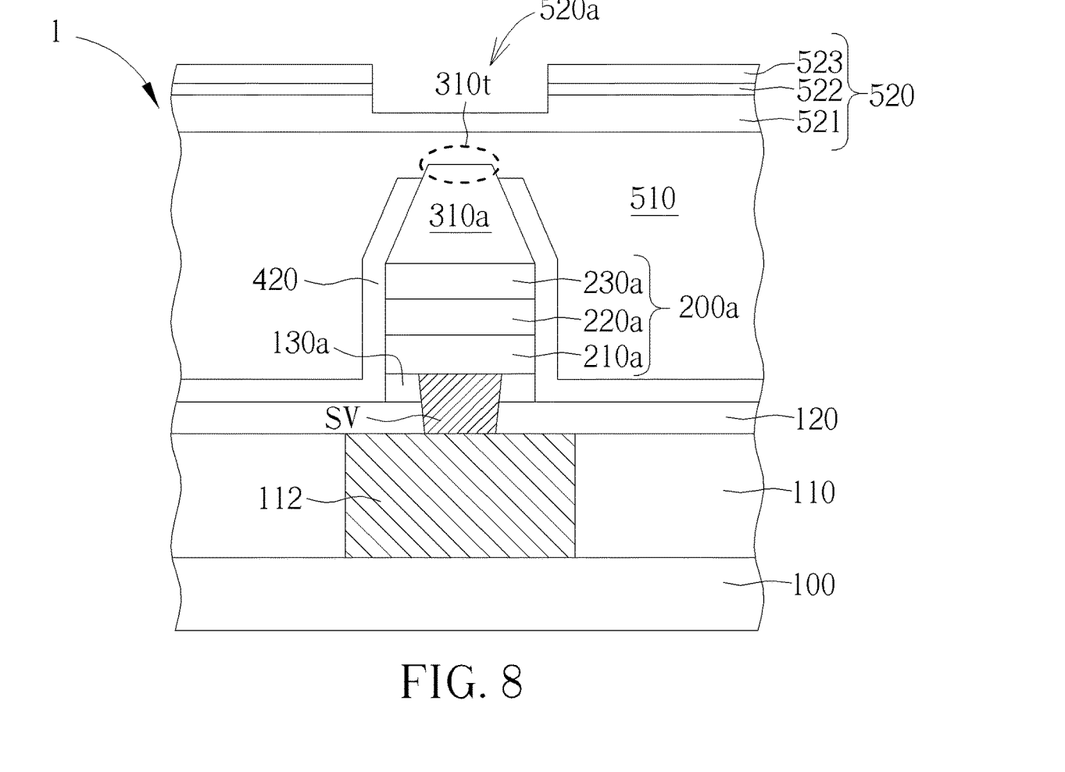

As shown in FIG. 8, subsequently, a hard mask 520 may be formed on the ultra-low k layer 510. For example, the hard mask 520 may be a tri-layer comprising a bottom silicon oxynitride layer 521, a middle titanium nitride layer 522, and a top silicon oxynitride layer 523. For example, the bottom silicon oxynitride layer 521 may have a thickness of about 400 angstroms, the middle titanium nitride layer 522 may have a thickness of about 120 angstroms, and the top silicon oxynitride layer 523 may have a thickness of about 250 angstroms. lithographic process may be performed to form a trench pattern 520a recessed into the top silicon oxynitride layer 523, the middle titanium nitride layer 522, and the bottom silicon oxynitride layer 521.

Figure 9:
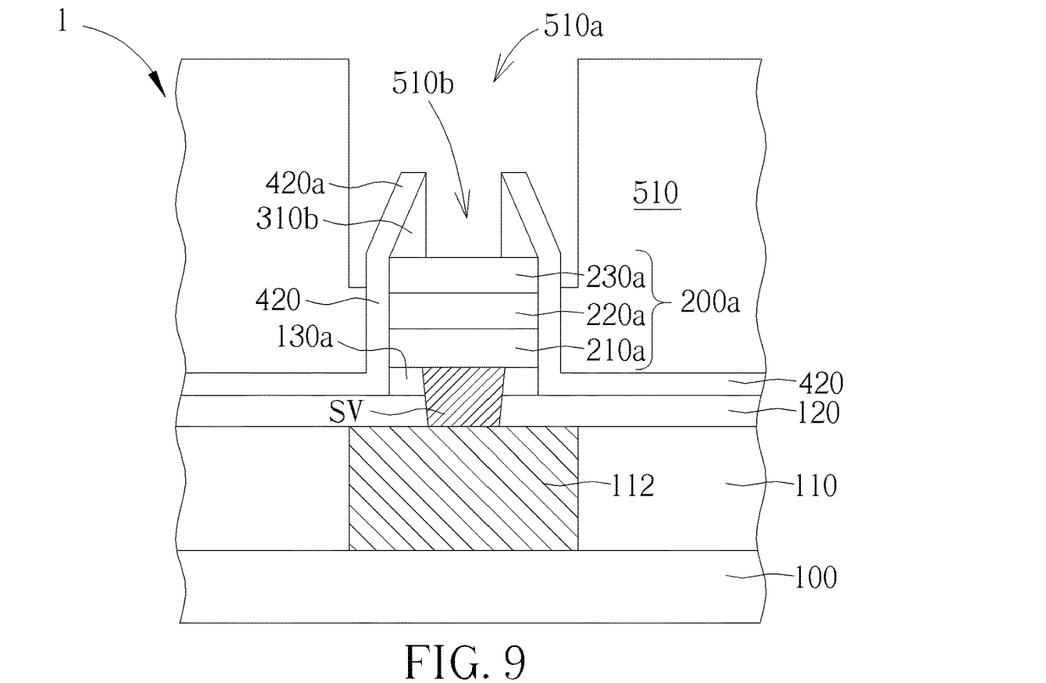

As shown in FIG. 9, an anisotropic dry etching process is performed to etch the remaining bottom silicon oxynitride layer 521, the ultra-low k layer 510, and the patterned hard mask layer 310a through the trench pattern 520a, thereby forming an opening 510a that exposes an annular, upwardly protruding portion 420a of the protective layer 420. The annular, upwardly protruding portion 420a protrudes from a bottom of the opening 510a and is disposed around a perimeter of the top electrode 230a. The opening 510a comprises a central opening 520b surrounded by the annular, upwardly protruding portion 420a. The central opening 520b partially exposes the top electrode 230a. According to an embodiment, an annular oxide layer 310b is formed directly under the annular, upwardly protruding portion 420a. The annular oxide layer 310b is in direct contact with the annular, upwardly protruding portion 420a.

Figure 10:
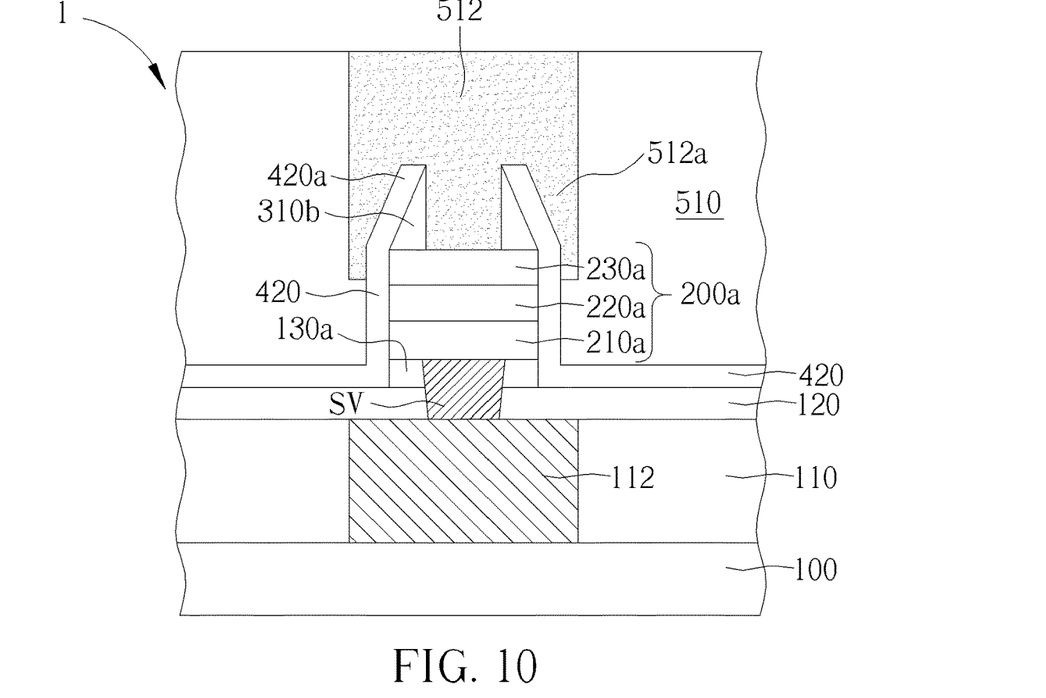

As shown in FIG. 10, subsequently, an upper metal interconnect layer 512 is formed in the opening 510a in the ultra-low k layer 510. According to some embodiments, a lower portion 512a of the upper metal interconnect layer 512 engages with the annular, upwardly protruding portion 420a. The upper metal interconnect layer 512 is in direct contact with the top electrode 230a. The annular oxide layer 310b is in direct contact with the lower portion 512a of the upper metal interconnect layer 512.

Figure 11:
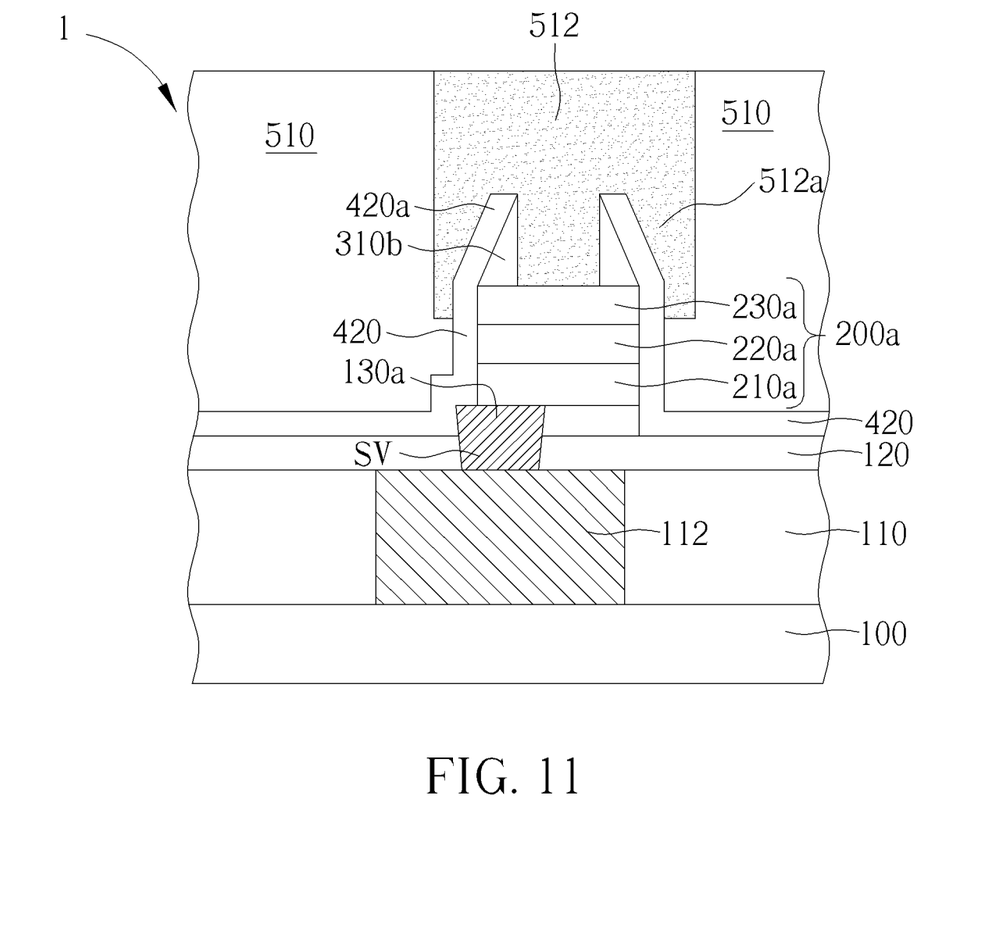
FIG. 11 shows a misalignment situation of the resistive random access memory (RRAM) device where the conductive via is not completely covered by the RSE structure.

In some embodiments, as shown in FIG. 11, the conductive via SV is misaligned with the RSE structure 200a. That is, the top surface of the conductive via SV is not completely covered by the RSE structure 200a. According to some embodiments, the protective layer 420 is in direct contact with a top surface and/or a sidewall of the conductive via SV. In such misalignment situations, the conductive via SV can be protected by the protective layer 420 during the subsequent metal interconnect forming process, and potential top metal and RSE bottom electrode bridging due to trench over-etching can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate having a first interlayer dielectric layer thereon;
   a lower metal interconnect layer in the first interlayer dielectric layer;
   a conductive via disposed on the lower metal interconnect layer;
   a bottom electrode disposed on the conductive via;
   a dielectric data storage layer having variable resistance disposed on the bottom electrode;
   a top electrode disposed on the dielectric data storage layer; and
   a protective layer covering sidewalls of the top electrode, the dielectric data storage layer, and the bottom electrode, wherein the protective layer comprises an annular, upwardly protruding portion around a perimeter of the top electrode, wherein the protective layer is in direct contact with a top surface or a sidewall of the conductive via.

2. The semiconductor memory device according to claim 1 further comprising:
   a second interlayer dielectric layer disposed around the conductive via and above the lower metal interconnect layer.

3. The semiconductor memory device according to claim 2, wherein the protective layer is in direct contact with the second interlayer dielectric layer.

4. The semiconductor memory device according to claim 2 further comprising:
   an etch stop layer disposed under the second interlayer dielectric layer and around the conductive via, wherein the etch stop layer caps the lower metal interconnect layer, and wherein the protective layer extends onto the etch stop layer.

5. The semiconductor memory device according to claim 3, wherein the etch stop layer is a nitrogen-doped silicon carbide layer.

6. The semiconductor memory device according to claim 1, wherein the conductive via is a copper via.

7. The semiconductor memory device according to claim 1, wherein the protective layer comprises silicon nitride, and wherein the protective layer has a thickness of about 200-400 angstroms.

8. The semiconductor memory device according to claim 1 further comprising:
   an annular oxide layer under the annular, upwardly protruding portion.

9. The semiconductor memory device according to claim 1 further comprising:
   an ultra-low dielectric constant layer covering the protective layer; and
   an upper metal interconnect layer in the ultra-low dielectric constant layer, wherein a lower portion of the upper metal interconnect layer engages with the annular, upwardly protruding portion.

10. The semiconductor memory device according to claim 1, wherein the top electrode and the bottom electrode comprise TaN, and the dielectric data storage layer comprises $Ta_2O_5$.

11. A method for forming a semiconductor memory device, comprising:
 providing a substrate having a first interlayer dielectric layer thereon;
 forming a lower metal interconnect layer in the first interlayer dielectric layer;
 forming a conductive via on the lower metal interconnect layer;
 forming a bottom electrode on the conductive via;
 forming a dielectric data storage layer having variable resistance on the bottom electrode;
 forming a top electrode on the dielectric data storage layer; and
 forming a protective layer covering sidewalls of the top electrode, the dielectric data storage layer, and the bottom electrode, wherein the protective layer comprises an annular, upwardly protruding portion around a perimeter of the top electrode, wherein the protective layer is in direct contact with a top surface or a sidewall of the conductive via.

12. The method according to claim 11 further comprising:
 forming a second interlayer dielectric layer disposed around the conductive via and above the lower metal interconnect layer.

13. The method according to claim 12, wherein the protective layer is in direct contact with the second interlayer dielectric layer.

14. The method according to claim 12 further comprising:
 forming an etch stop layer under the second interlayer dielectric layer and around the conductive via, wherein the etch stop layer caps the lower metal interconnect layer, and wherein the protective layer extends onto the etch stop layer.

15. The method according to claim 14, wherein the etch stop layer is a nitrogen-doped silicon carbide layer.

16. The method according to claim 11, wherein the conductive via is a copper via.

17. The method according to claim 11, wherein the protective layer comprises silicon nitride, and wherein the protective layer has a thickness of about 200-400 angstroms.

18. The method according to claim 11 further comprising:
 forming an annular oxide layer under the annular, upwardly protruding portion.

19. The method according to claim 11 further comprising:
 forming an ultra-low dielectric constant layer covering the protective layer; and
 forming an upper metal interconnect layer in the ultra-low dielectric constant layer, wherein a lower portion of the upper metal interconnect layer engages with the annular, upwardly protruding portion.

20. The method according to claim 11, wherein the top electrode and the bottom electrode comprise TaN, and the dielectric data storage layer comprises $Ta_2O_5$.

* * * * *